(12) United States Patent
Tuggle et al.

(10) Patent No.: US 8,803,102 B2
(45) Date of Patent: Aug. 12, 2014

(54) RETARDING FIELD ANALYZER INTEGRAL WITH PARTICLE BEAM COLUMN

(71) Applicant: FEI Company, Hillsboro, OR (US)

(72) Inventors: David William Tuggle, Portland, OR (US); James B. McGinn, Portland, OR (US); Charles Otis, Hillsboro, OR (US)

(73) Assignee: FEI Company, Hillsboro, OR (US)

(*) Notice: Subject to any disclaimer, the term of this patent is extended or adjusted under 35 U.S.C. 154(b) by 0 days.

(21) Appl. No.: 13/847,313

(22) Filed: Mar. 19, 2013

(65) Prior Publication Data

US 2014/0117233 A1    May 1, 2014

Related U.S. Application Data

(60) Provisional application No. 61/718,684, filed on Oct. 25, 2012.

(51) Int. Cl.
*H01J 37/12* (2006.01)
*H01J 37/28* (2006.01)

(52) U.S. Cl.
USPC ....... 250/396 R; 250/305; 250/310; 250/306; 250/307; 250/397

(58) Field of Classification Search
USPC ............... 250/396 R, 305, 310, 306, 307
See application file for complete search history.

(56) References Cited

U.S. PATENT DOCUMENTS

| | | | |
|---|---|---|---|
| 5,767,515 A * | 6/1998 | Honda | 250/310 |
| 6,501,076 B1 | 12/2002 | Kelly et al. | |
| 7,015,481 B2 * | 3/2006 | Matsuya | 250/398 |
| 7,109,483 B2 * | 9/2006 | Nakasuji et al. | 250/310 |
| 7,241,361 B2 | 7/2007 | Keller et al. | |
| 7,670,455 B2 | 3/2010 | Keller et al. | |
| 8,168,957 B2 | 5/2012 | Keller et al. | |
| 2012/0319000 A1 | 12/2012 | Keller et al. | |

* cited by examiner

*Primary Examiner* — Nikita Wells

(74) *Attorney, Agent, or Firm* — Scheinberg & Associates, PC; Michael O. Scheinberg

(57) ABSTRACT

A retarding field analyzer uses the existing components of a charged particle beam system eliminating the need for inserting a separate retarding field analyzer device. Using components of the existing column reduces the time required to analyze the beam. Using the imaging capabilities of the existing column facilitates alignment of the beam with the analyzer.

25 Claims, 8 Drawing Sheets

RETARDING FIELD ANALYZER INTEGRAL WITH PARTICLE BEAM COLUMN

This application claims priority from U.S. Prov. Appl. No. 61/718,684, filed Oct. 25, 2012, which is hereby incorporated by reference.

TECHNICAL FIELD OF THE INVENTION

The present invention relates to charged particle beam devices and more particularly to a retarding field analyzer for analyzing charged particle beams.

BACKGROUND OF THE INVENTION

For charged particle beams such as electron beam systems and focused ion beam (FIB) systems, beam quality is very important to imaging performance. In particular the uniformity of particle kinetic energy is an important quality. Ideally, all particles in the beam have the exact same kinetic energy. Particles having different energies focus at different points, thereby enlarging the spot size of the beam on the work piece and reducing resolution. This is referred to as chromatic aberration. In order to evaluate the uniformity of the energies of the particles in the beam, it is important to be able to measure the distribution of particle kinetic energy in the beam. It can also be important to determine the absolute energy of the particles in the beam. The absolute energy and the energy distribution are typically measured by a retarding field analyzer (RFA).

To measure the beam energy and/or energy distribution, the RFA is temporarily inserted into the charged particle beam system downstream of the focusing column. The retarding field strength is increased incrementally, and the beam current that passes through the retarding field after each incremental field strength increase is measured. Eventually, the incremented retarding field will be sufficiently strong to stop all particles in the beam from passing through the field. RFAs typically include a filter lens or a grid to which a voltage is applied to produce the retarding field. Using an RFA requires mounting additional equipment after the focusing column, which entails additional costs. The RFA requires additional vacuum electrical feed-throughs and wiring to connect the additional equipment, extra power supplies that are highly regulated, and some type of beam detector. Significant time is required to place the RFA into operation.

Because the beam energy at the retarding element is very low, the beam is easily disturbed, making precise beam alignment important to reduce measurement error. RFAs typically direct the beam into a Faraday cup and do not have imaging capability, so it can be difficult to verify that the beam is accurately aligned with the RFA.

SUMMARY OF THE INVENTION

It is an object of the present invention to provide a retarding field analyzer for a charged particle beam system.

The present invention uses existing elements of a charged particle beam system to provide retarding field energy analysis. The focusing lens of the optical column is used to provide a retarding field analyzer integral to the column. The imaging capability of the column can be used to align the beam for analysis in some embodiments. Beam current after the retarding element can be measured, for example, using a current meter connected to a Faraday cup, by observing the gray level of an image of a work piece, or by measuring stage current.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

Definitional note: when referencing the charged particle beam device, the terms "before" and "after" relate to the direction of particle travel, so that if element B is positioned after element A, the particles pass element A prior to passing, or otherwise encountering B.

Figure 1:
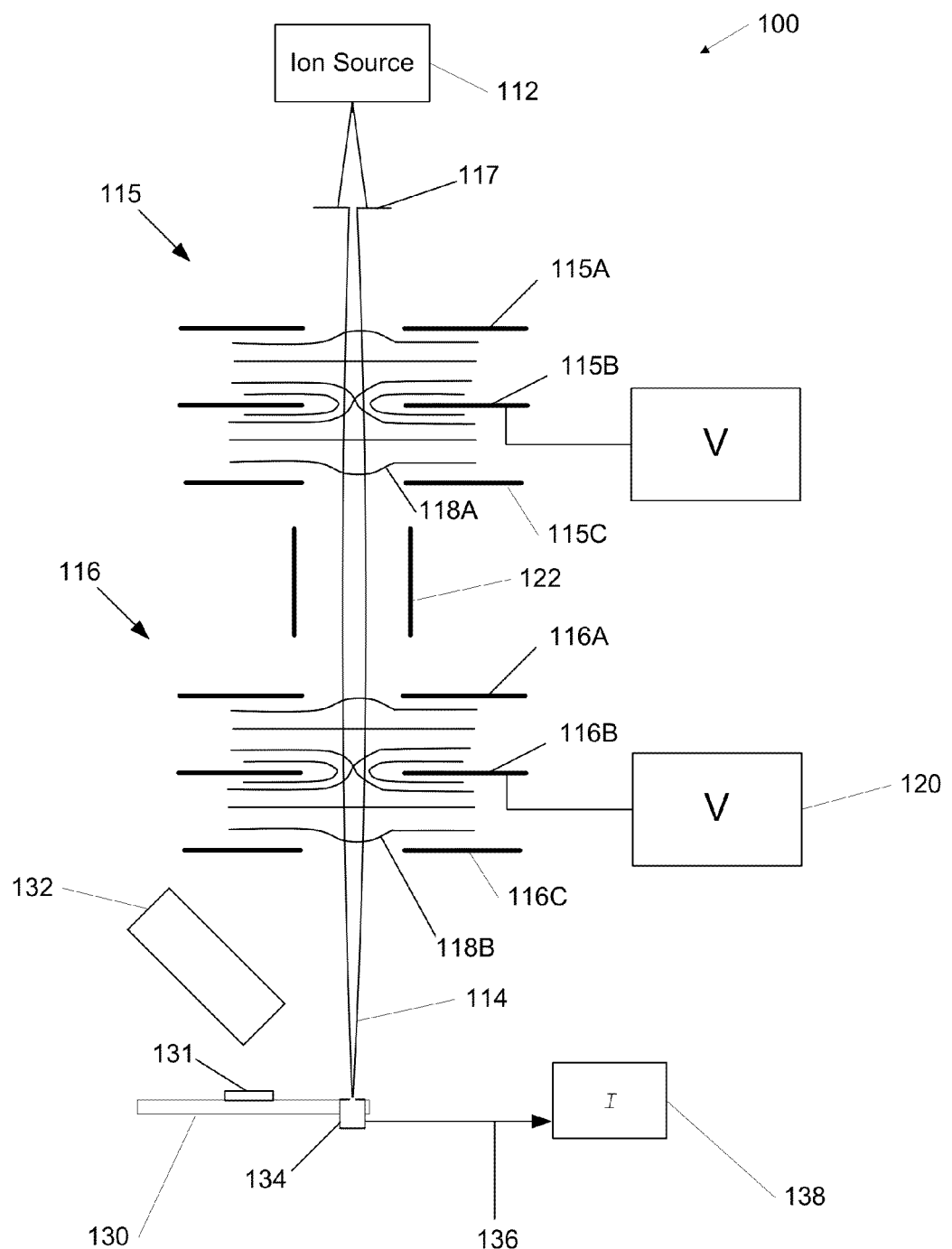
FIG. 1 shows a schematic view of a charged particle beam system according to an embodiment of the present invention.

One embodiment of the present invention comprises a focused ion beam (FIB) system 100, having a retarding field analyzer (RFA) integral with its focusing column, and a method of using the same Skilled persons will recognize that the invention is generalizable to other focused ion beam (FIB) systems, electron beam systems, such as electron microscopes, and other charged particle beam devices. Referring to FIG. 1, a FIB 100 system includes an ion source 112, such as a liquid metal ion source or a plasma ion source, producing an ion beam 114. FIB system 100 includes an optional first electrostatic focusing lens 115 (referred to as "lens 1"), including an upper lens element 115A, a center lens element 115B, and a lower lens element 115C and a second electrostatic focusing lens 116 (referred to as "lens 2") including an upper lens element 116A, a center lens element 116B, and a lower lens element 116C.

The upper lens element 116A, and lower lens elements 115C and 116C, are typically maintained at ground potential, with the middle lens elements 115B and 116B can be either positive or negative with respect to ground; thereby creating the electrical equipotential lines 118A and 118B as shown. Lens element 115A is at a potential equal to the beam voltage minus the extraction voltage, typically 30,000 V minus 10,000 V, or 20,000 V. Upper lens element 116A and lower lens elements 115C and 116C may be set at potentials other than ground in some embodiments. A precisely adjustable, highly stable power supply 120 sets the voltage for the middle lens element 116B. In some embodiments, the power supply 120 is capable of producing a higher voltage and higher precision than a typical power supply in a charged particle beam system without an integrated RFA. An aperture 117 limits the size of beam 114. Deflectors 122 are used to direct the beam, often in a raster pattern, to process or form an image of a target. Deflectors 122 are also used to position the beam on the target electronically, whether or not the beam is rastering. The steering deflectors are generally dipole units, one for x and one for y deflection, although octupole assemblies that deflect the beam simultaneously in x and y could be used.

A stage 130 is adapted to support a sample 131. A secondary electron detector 132 receives secondary electrons emitted from the sample or other targets in response to ion or electron bombardment, thereby permitting an image to be formed by associating the strength of the secondary electron current with the position of the beam in the raster scan, and forming an image in which the gray level at each point corresponds to the secondary electron current. A Faraday cup 134 is located near the edge of stage 130, and is electrically connected to a sensitive current meter 138, for measuring the current of charged particles entering into the Faraday cup 134. The current meter 138 and its manner of connection to Faraday cup 134 are preferably such that current variations of less than two picoamperes or more preferably, less than one picoampere can be measured. In one preferred embodiment current variations of less than 100 femtoamperes can be measured. To reduce noise, the current meter is positioned close to the Faraday cup 134, which limits resistance and avoids induced voltages, and the electrical connection between the current meter and the Faraday cup 134 is preferably via a triaxial cable 136 or other low-noise connector.

The charged particle beam column of FIG. 1 is typically a conventional electrostatic charged particle beam column. Preferred embodiments of the invention use the existing focusing lens of the charged particle beam column to provide the retarding field of the retarding field analyzer, thereby obviating the need for reconfiguring the column and adding additional equipment. In some embodiments, the conventional lens power supply may be modified to provide a higher voltage and/or high resolution. The resolution of the energy analyzer depends in part on the minimum size of voltage increment that can be provided by the power supply. The desired resolution for a specific implementation typically depends on the energy spread of the beam being measured. Different types of ion sources have different energy spreads. For example, a typical energy spread of a liquid metal ion source is about 5 eV, a typical energy spread of a plasma ion source is about 20 eV, and a typical energy spread of a magneto-optical trap ion source (MOTIS) can be 0.100 eV or less. An energy analyzer preferably has a resolution of at least one twentieth of the energy spread. That is, an energy analyzer used in a column having a liquid metal ion source will preferably have a resolution of better than 0.25 eV and require a power supply able to increment voltage in steps of 0.25 V or less. An energy analyzer used in a column having a plasma ion source will preferably have a resolution of better than 1.0 eV and require a power supply able to increment voltage in steps of 1.0 V or less. An energy analyzer used in a column having a MOTIS will preferably have a resolution of better than 0.005 eV and require a power supply able to increment voltage in steps of 0.005 V. In less demanding application, a voltage increment size of one tenth or smaller of the beam energy may be acceptable, while in other application, an increment size of one thirtieth or smaller of the beam energy spread may be desired.

For example, the power supply may provide voltage setting in increments of less than about 1.0 V, such as less than about 0.5 V, less than about 0.3 V, or less than about 0.1 V, to provide higher resolution measurements of the beam energy. The smaller incremental voltage steps may require a more accurate digital-to-analog (DAC) converter, such as a one or more DACs using a total of at least 16 bits, for example, an 18 bit DAC or a 32 bit DAC. Some embodiments use a stack of more than one DAC, for example, with one 16 bit DAC covering 0-35 kV and another 16 bit DAC controlling the same power supply over a 1 kV range, to get the resolution desired for energy analysis.

In some embodiments, the accelerating voltage of the charged particle beam may be reduced during retarding field analysis so that the required voltage of the center lens element is within the capability of an existing power supply. The accelerating voltage may also be reduced so that the required voltage of the center lens element is not so great as to cause arcing within some focusing lens systems having a smaller lens element gaps. The longitudinal energy spread of the beam typically does not vary significantly as the accelerating voltage or column length is changed, so the longitudinal energy spread determined at lower beam energy can be used to determine the energy spread of the beam at the higher, operating beam energy.

Figure 4:
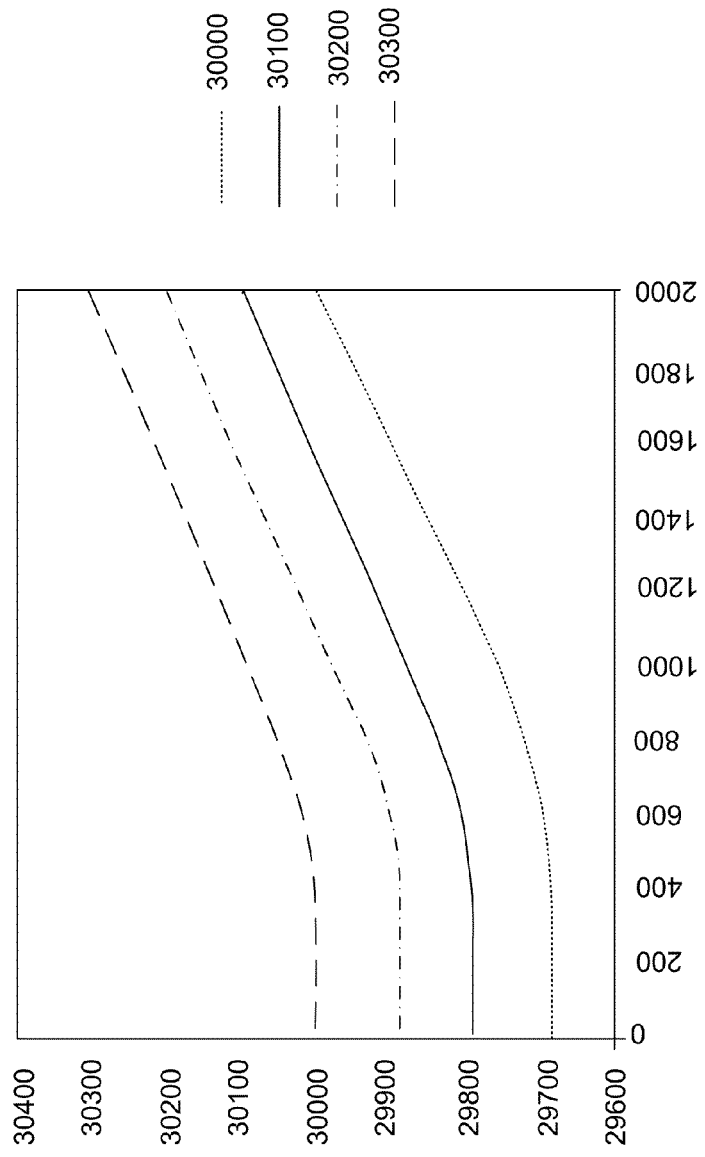
FIG. 4 shows the electrical potential in a lens from the optical center line radially outward to the lens element for different values of voltages applied to the lens for one embodiment of the invention.
Figure 5:
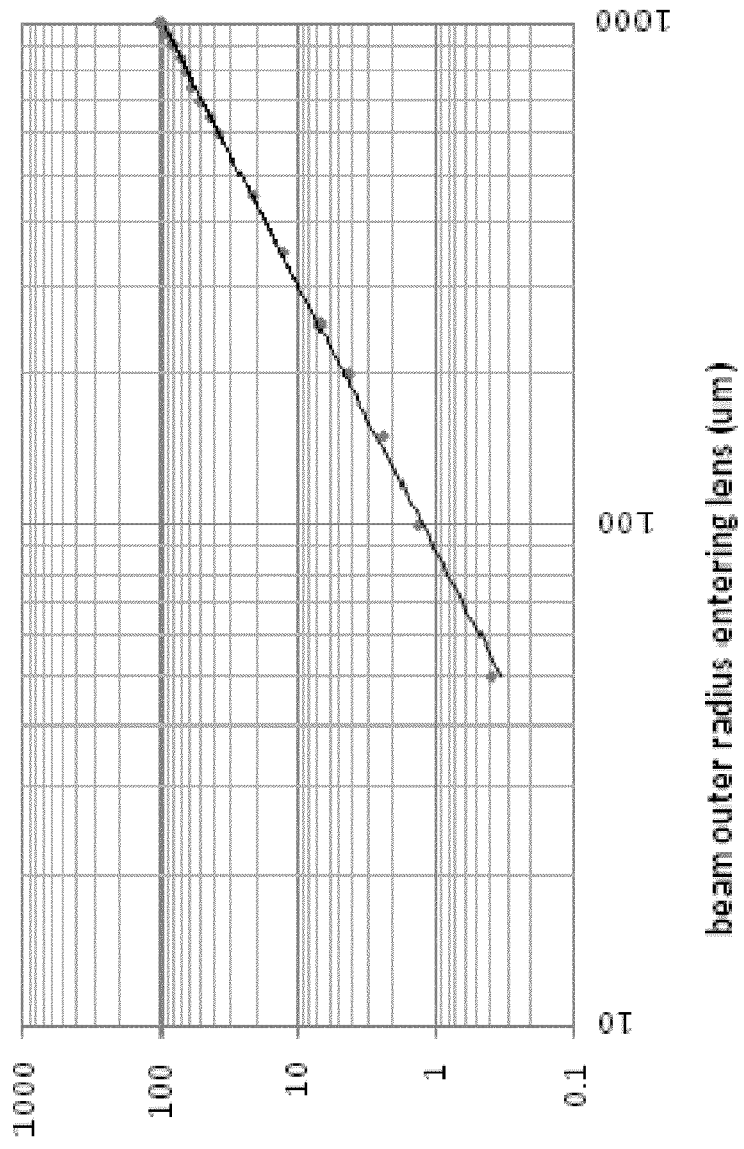
FIG. 5 shows, for one lens design, the difference between the electrical potential at the center of the beam (r=0) and at the beam radius, as a function of the radius of the beam radius entering the lens.
Figure 6:
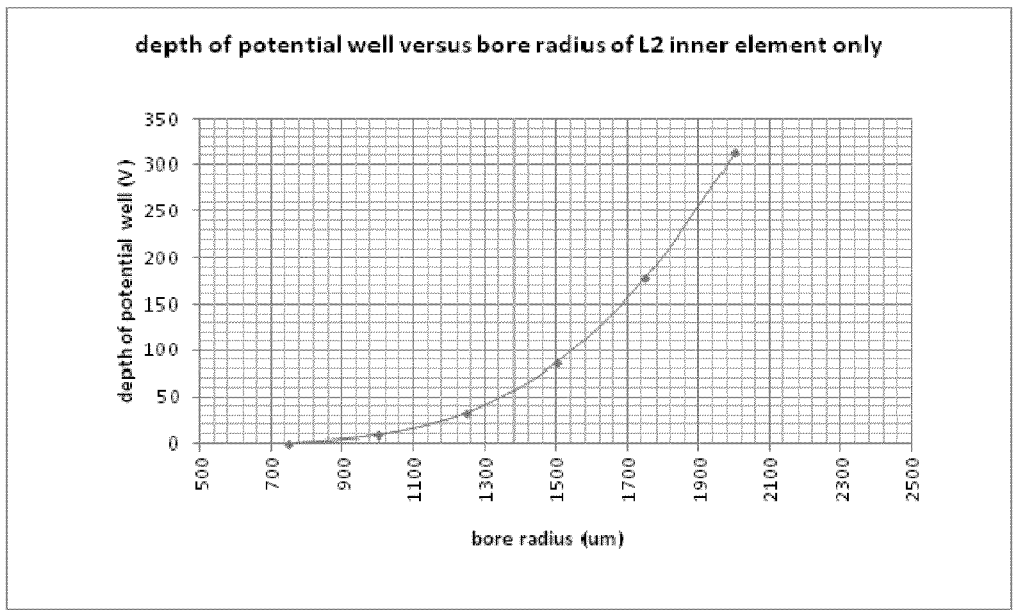
FIG. 6 shows, for lens bores having radii between 0 mm (a metal plate with no bore) and 2 mm, the depth of the potential well as determined by a model of a particular lens.

The center lens element typically has a bore diameter of, for example, about 5 mm. The beam diameter is typically about 0.1 mm at the lens bore. The electrical potential within the lens element will not be the same as the voltage applied to the lens element and the electrical potential will not be uniform within the lens bore. To determine the energy of the beam, it is necessary to determine the value of the retarding field at the position in the lens where the beam passes. The field within the lens can be determined by simulations. The results of some simulations are shown in FIGS. 4-6 below, which are described in more detail below. To determine the energy spread of the beam, rather than the absolute value of the energy, it is unnecessary to determine precisely the electrical potential along the optical axis. Determining the absolute energy calibration is useful, for example, when determining the energy of a beam from a plasma source in which the beam energy is not identical to the voltage applied to the system components.

Figure 2A:
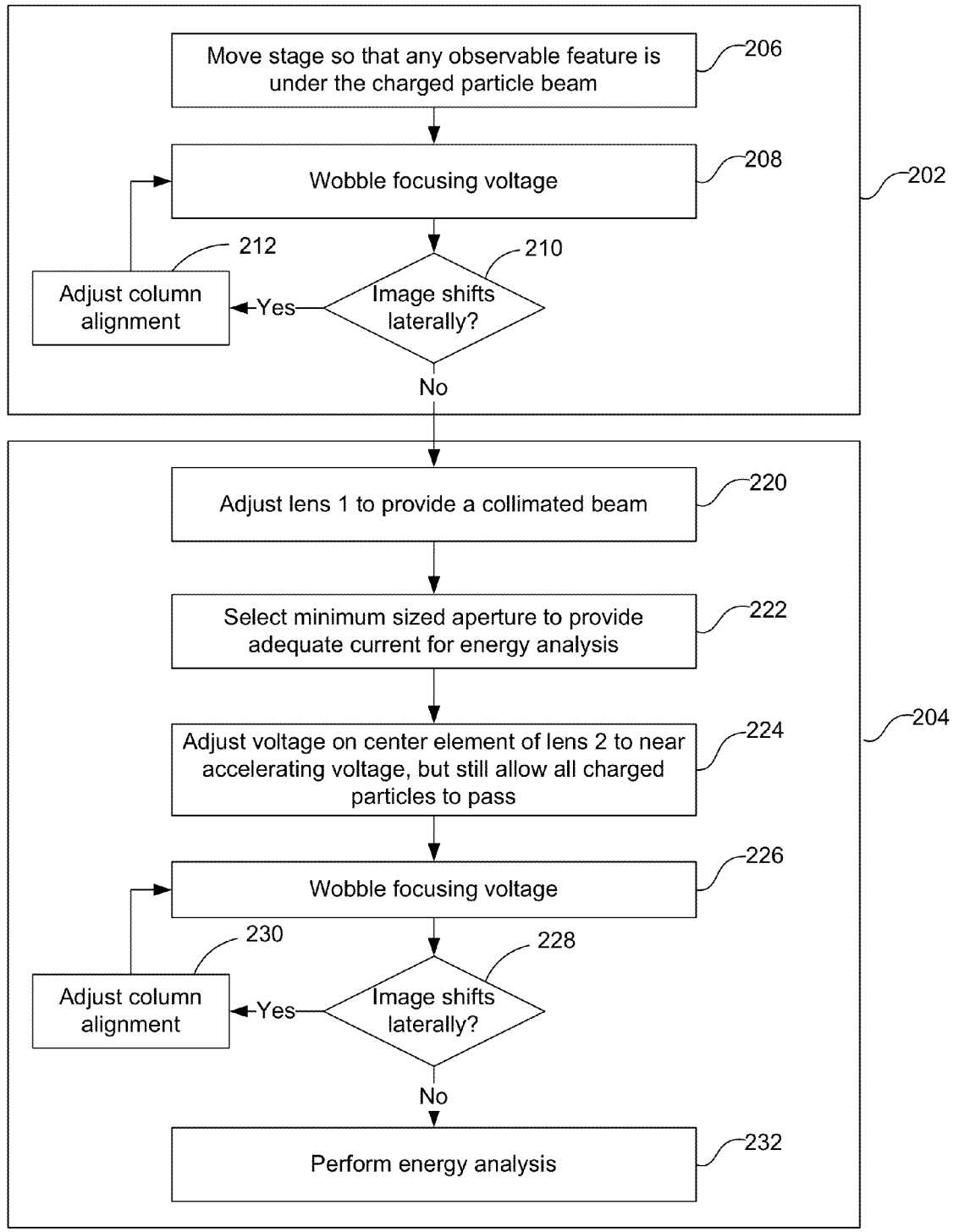
FIG. 2A is a flow chart showing the steps of one method for aligning a column before performing retarding field analysis.

Before measuring the energy of the beam, it is necessary to align the beam. FIG. 2A is a flowchart of the steps used to align the beam. Precise alignment of the beam with the retarding lens is important, because as the voltage applied to the center lens element increases, the energy of the charged particles at the center lens element decreases. When the beam energy is very small, the charged particles can be easily deflected by being off-axis in the lens focusing field. For that reason, it can be important to have the beam properly centered on the retarding field, so that the energy analysis will not be compromised by entering the lens retarding field off-axis.

Beam alignment for an RFA typically comprises two parts: normal alignment of the lens as shown in box 202 and alignment of the lens near the cut-off potential, as shown in box 204. In some embodiments, the optical column may be so well-aligned mechanically that part of the alignment process can be skipped, particularly the alignment of the beam near the cut-off potential. In step 206, the sample stage is moved so that an observable feature is within the raster pattern of the charged particle beam. The image is formed using secondary electron detector 132 and with the focusing column operating in its normal mode, e.g., a beam landing energy of about 30 keV for a FIB system. The voltage on center lens element 116B may be, for example, about 18,000 V, and upper lens element 116A and lower lens element 116C are typically grounded. For example, the image formed may be of the top of Faraday cup 134. When the beam is scanned over the hole in the top of the Faraday cup by deflectors 122, the beam enters the cup during a portion of the scan. Secondary electrons generated at the bottom of the cup will not escape the cup and will therefore not be detected by detector 132. The part of the raster scan during which the beam enters the hole in the Faraday cup will therefore appear black. When the beam hits the metal top of the Faraday cup, secondary electrons will be generated and will be detected—the top of the cup will therefore appear lighter. The image formed by the beam rastering over the top of the cup will therefore be a lighter rectangle having a black hole near the center.

In step 208, the focusing voltage on the center lens element 116B is "wobbled," that is, varied slightly, perhaps 10V-15V, and the image is observed. If the image is found to shift laterally in decision block 210, the alignment of the column is adjusted in step 212, mechanically by adjusting the ion source and/or lens positions, or electronically, by shifting the beam. The voltage is again wobbled, and the image observed to see whether or not it shifts in decision block 210. The sequence of adjusting and observing is continued until the image no longer shifts laterally when the focusing voltage is wobbled, which indicates the column is aligned and normal alignment is complete.

After the normal alignment, the column is aligned again near the cut-off potential, i.e., with the center element of the lens near the beam energy, as shown by the steps in block 204. In step 220, lens 115 is adjusted to provide a collimated beam 114. In step 222, an aperture 117 having the minimum diameter necessary to pass adequate current for energy analysis is inserted into the beam path. The combination of aperture diameter and the voltage on lens element (115B) also determines the maximum diameter of the beam envelope entering lens 116, which determines the energy resolution as described below and shown in FIG. 5. In step 224, the voltage on center element 116B is adjusted to be near the accelerating voltage, but to still allow all charged particles to pass. In step 226, the focusing voltage on the center lens element 116B is "wobbled," and the image is observed. If the image is found to shift laterally in decision block 228, the alignment of the column is adjusted in step 230 electronically, by shifting the beam. The voltage is again wobbled, and the image observed to see whether or not it shifts in decision block 228. The sequence of adjusting and observing is continued until the image no longer shifts laterally when the focusing voltage is wobbled, which indicates the column is aligned near the cut-off voltage. After the beam is aligned at normal operating voltage and near the cut off voltage, the retarding field analysis is performed as indicated in step 232.

The focusing voltage on lens element 116B is slowly adjusted so that it starts to cut off the beam current. In this condition, if the beam is scanned, there will not be a focused image, but rather a large white round blur. As the focus voltage on lens element 116 gradually increases and cuts off the beam, the white round blur shrinks in size and gradually disappears. This occurs because the beam is scanning over the saddle point in the lens and the saddle cutoff is seen in the image. If the round blur shrinks symmetrically, the beam is aligned with the saddle point in the lens. If not, then the beam needs to be redirected to fulfill that condition, usually by means of the deflection assembly 122, which consists of beam steering plates as well as beam deflection (rastering and patterning) plates.

Figure 2B:
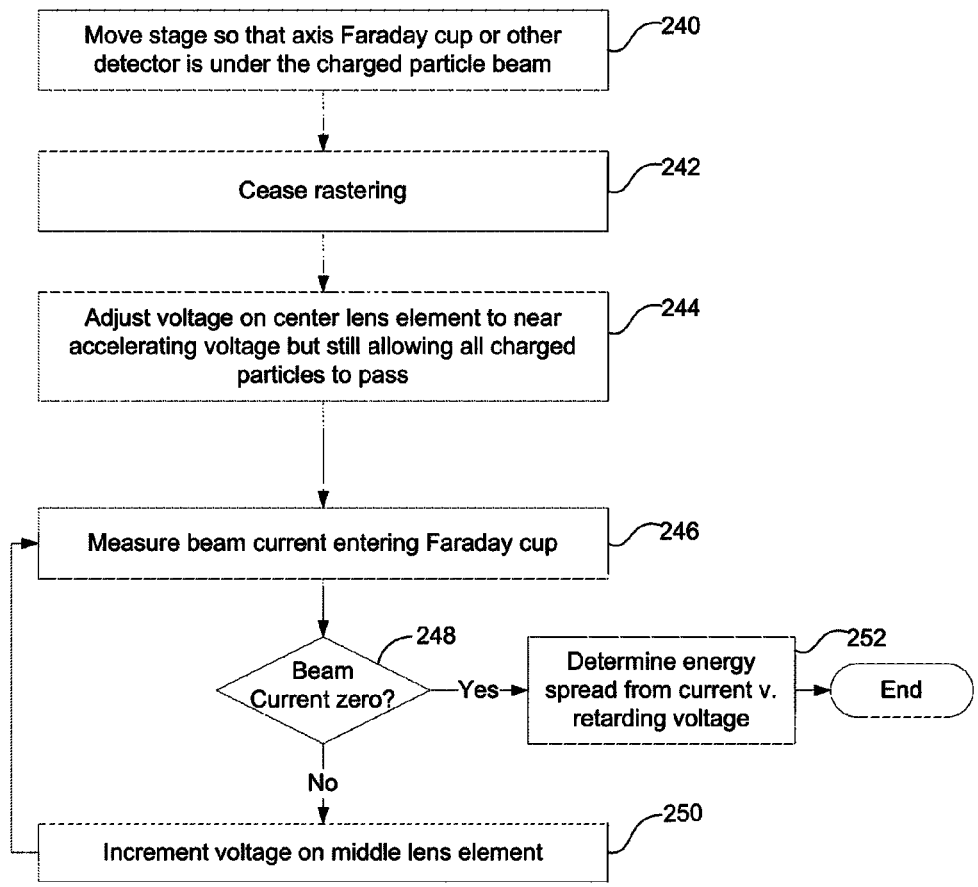
FIG. 2B shows the steps of employing a retarding field analyzer in accordance with one embodiment of the invention.

FIG. 2B shows the steps of performing a retarding field analysis in accordance with one embodiment of the invention. In step 240, the stage is moved so that the center axis of Faraday cup, or any other device used in the determination of the beam current, is under the charged particle beam. In step 242, the rastering is ceased. In step 244, the voltage on the center lens element 116B is adjusted to a voltage near the accelerating voltage, but still allowing all charged particles to pass. The beam passes approximately through the center of the lens 116, and the potential in the center of the lens will be somewhat less than the voltage applied at lens element 116B. For example, if a voltage of 30,000 V is placed on center lens elements 116B, the potential along the optical axis in the center of lens element 116B may be closer to 29,700 V. Because the energy spread in the nominal 30 keV beam is typically less than 100 V, essentially all the charged particles in the beam will pass through the lens when 30,000 V is applied to the center lens element.

Figure 7:
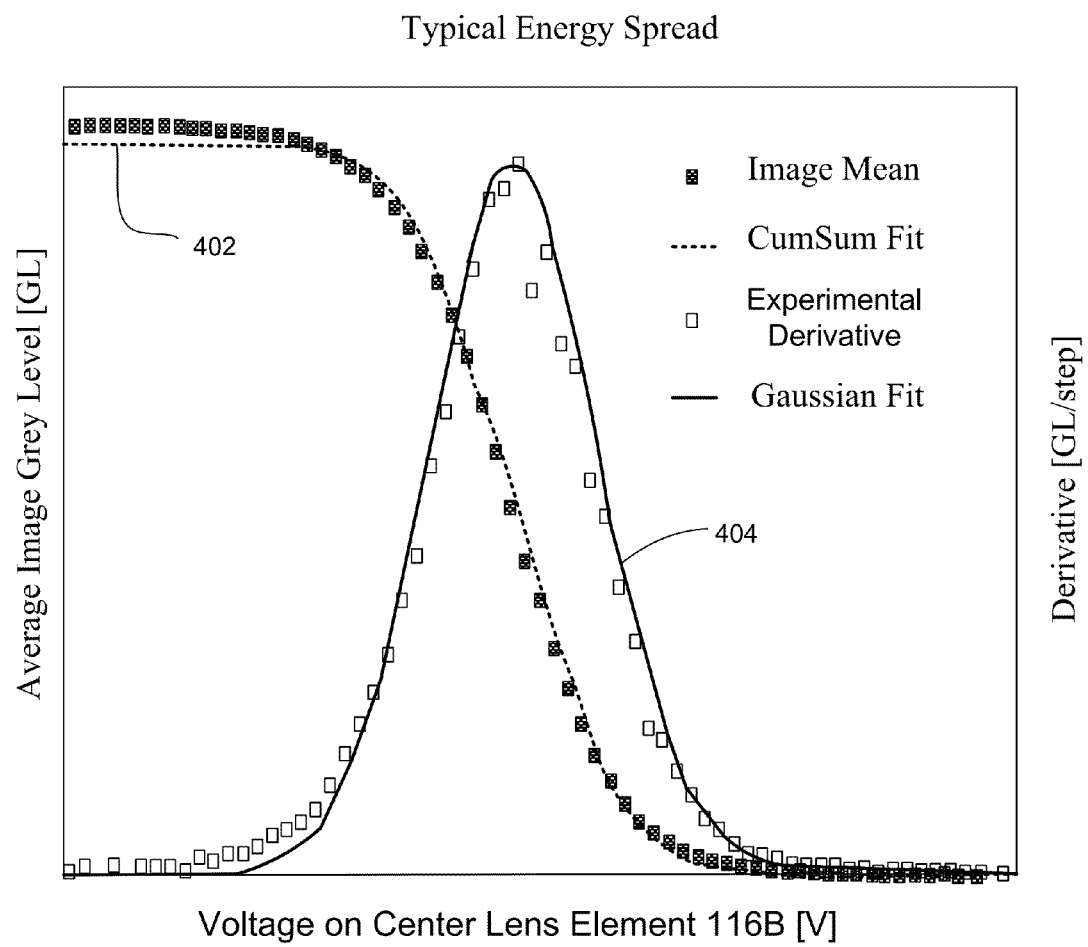
FIG. 7 shows a plot of gray level (GL) versus retarding potential, as well as a derivative of the plot.

In step 246, the beam current is measured using a Faraday cup and current meter 138, or any other type of measurement that provides information about the beam current, such as gray level or stage current. FIG. 7, described in more detail below, shows beam current determined by gray level. In decision block 248, the system determines whether or not the beam current is zero. If the beam current is zero, that is, if all the charged particles are stopped by the retarding field, then the data collection for the analysis is complete. The current at different voltage levels on center lens element 116B can then be compared to determine the beam energy or beam energy spread. If the current is not zero, the voltage on the center element 116B is incremented in step 250 and the current is measured again in step 246. The increment used will depend on the desired resolution for the energy analysis and on the resolution of the voltage supply. For example, the increment can be 1.0 V, 0.5 V, 0.3 V or 0.1 V. A plot of the current against voltage on the center lens element 116B can be expected to be in a shape similar to an error function.

Figure 3:
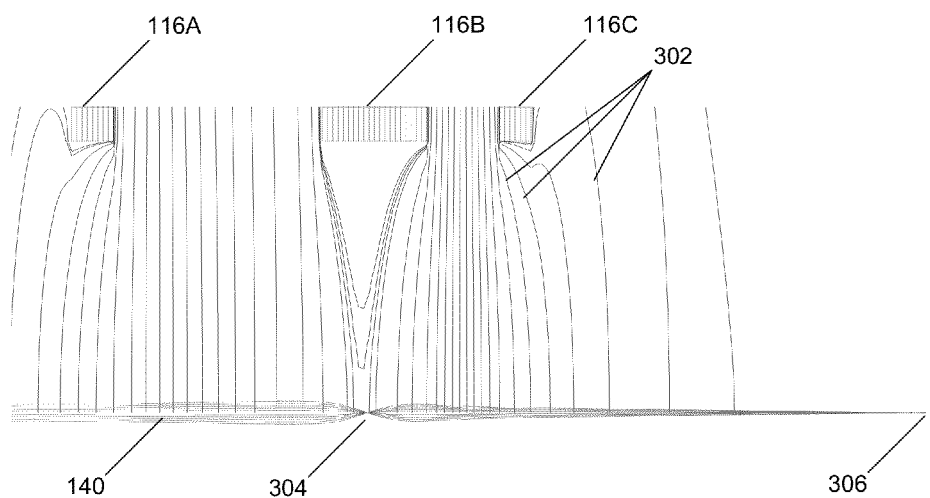
FIG. 3 shows a simulation of a charged particle beam in a retarding field analyzer embodying the invention.

FIG. 3 shows modeling of a charged particle beam passing through the center lens element 116B at a voltage slightly below the cutoff voltage. FIG. 3 shows lens elements 116A, 116B, and 116C, as well as the field lines 302. The voltage applied to the center electrode element 116B during retarding field analysis is much higher than the voltage applied to lens element 116B during normal focusing operation. The high voltage causes a beam crossover 304 positioned within center lens element 116B and second cross over 306 at the image plane.

The performance of an energy analyzer can be assessed in terms of a variety of evaluative merits. One most notable evaluative merit is the resolution versus acceptance size. Accepting a large beam size leads to lower resolution and accepting a smaller beam size leads to a higher resolution. In a preferred embodiment, the RFA is operated within a set of conditions in which the beam size entering the RFA results in the desired resolution. Most electrostatic charged particle beam lenses contain a saddle field such that the axial potential is less than the voltage applied to the lens element. FIG. 3 shows a potential drop between the middle lens element 116B and the center of the optical axis at 304. For example, for the condition of a middle element 116B 5 mm long with a bore radius of 2 mm, the maximum axial potential is 29,989.85 V from the applied voltage to the middle lens element of 30,302.5 V.

Determining the potential within the lens, one must be concerned not only with the voltage in the center of the lens along the lens axis, but also with the off-axis variation of potential. FIG. 4 shows the electrical potential within the lens, at points extending radially outward from the lens axis to the lens element, for different values of voltage applied to the center lens element. From FIG. 4 the off-axis potential at the peak of the saddle field for different voltages can be seen, specifically 30,000 V; 30,100 V; 30,200 V; and 30,300 V, applied to the middle lens element.

The change in beam energy across the lens bore causes the resolution of the analyzer to be limited by the beam diameter because charged particles at the edges of the beam will see a different retarding potential than charged particles in the center of the beam. FIG. 5 shows, for one lens design, the difference between the saddle point electrical potential at r=0 and at the saddle point beam radius, as function of the radius of the beam entering the lens. From FIG. 5 one can determine the maximum allowable beam radius entering the lens for a given beam energy resolution for a lens geometry having middle element 5 mm long with a 2 mm radius bore. For example, a 100 μm radius beam cannot have its energy resolution determined to better than 1.05 V. Similarly, a beam entering the lens with a 50 μm radius cannot be energy resolved to less than 0.4 V. Similarly, it can be understood that for a beam entering the lens off-axis, the RFA resolution is reduced by the potential offset shown in FIG. 5. Hence it is desirable to assure good beam alignment using the alignment procedures described above or other alignment methods.

FIG. 6 shows how the depth of the saddle field varies with the diameter of the lens bore. Specifically, FIG. 6 shows the difference between the voltage applied to the lens element and the axial potential in the saddle field (defined as the depth of the potential well) versus the lens bore radius for a 5 mm long lens element 116B. It can be seen that for this particular lens design, the maximum axial potential is approximately 300 V less than the voltage applied to the lens element for a lens bore that is 2 mm in radius.

As shown by FIGS. 4, 5 and 6, the beam coming into lens 2 is preferably carefully aligned and focused so that the charged particles pass through the lens near its center to minimize the effects of the axial variations in the electric field.

Rather than measuring the current using Faraday cup 134 and current meter 138, the beam could be directed to a sample, such as a semiconductor wafer, and the beam current can be inferred from the secondary electron current generated by the beam. The secondary electron current can be detected as stage current or as gray level of a secondary electron image. FIG. 7 shows a plot of the measured gray level (filled rectangles) versus the voltage on second lens element 116B. As shown in FIG. 7, as the voltage on lens element 116B increases, the gray level decreases to zero, with the data points approximating an error function 402. FIG. 7 also shows the derivative (empty rectangles) of the measured gray level, the derivative approximating a Gaussian function 404. The details of the energy spread which are of interest are not only the width of the function but the tails. In the derivative (empty rectangles), one can see an asymmetric energy tail. In another embodiment, the beam current is determined by measuring the stage current when the stage is electrically biased to suppress secondary electrons emission. The stage current will then represent the primary beam current only.

Embodiments of the invention can be used, for example, to evaluate design changes to a FIB device. For example, if an energy filter were to be added to a FIB, in order to achieve greater uniformity of ion kinetic energy values, then the RFA-integrated focus column 116 can be used to measure the beam improvement resulting from this design change.

Embodiments of the invention allow the energy or energy spread of the beam to be measured in-situ, that is, without removing the emitter from the column and without opening the column to add additional measuring equipment. The energy or energy spread can be analyzed, and then the charged particle beam system can be used to process a sample, without having to open the vacuum chamber to remove or reconfigure equipment. Embodiments of the present invention can therefore be used to test the operation of the emitter, either periodically to monitor the operation and aging of the emitter, or for trouble shooting if a problem is suspected. For example, if FIB device 100 has a heated ion source, such as liquid metal ion source (LMIS) or a single element heated ion source, the RFA-integrated focus column 116 can be used to periodically evaluate the beam 114 to ensure that liquid metal evaporation, over time is not causing overheating by the heating element, thereby causing changes in the characteristics of beam 114. The same process can be used for evaluating the operation of a plasma ion source, such as the inductively coupled plasma source described in U.S. Pat. No. 7,241,361. The invention can be used for verifying or tuning an in-column energy filter to the desired beam energy spread.

While the embodiment above describes increasing the voltage on the lens from a voltage at which essentially all the charged particles pass through the lens to a voltage at which essentially no charged particles pass through the lens, the voltage could start out with essentially no particles passing through the lens, and then the voltage could be decreased incrementally until essentially all particles pass through the lens. In some embodiments, the voltage need not be scanned over the full range between full current and no current, but can be scanned over a partial range. Also, the voltage need not be incremented discretely, but could be varied in a continuous fashion.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A method of analyzing the energy of a charged particle beam in a particle optical column including a charged particle source and an electrostatic focusing lens, comprising:

extracting charged particles from the charged particle source;

directing the charged particles toward the electrostatic focusing lens;
applying a voltage to an element of the electrostatic focusing lens to retard the charged particles;
incrementally changing the voltage on the element to alter the number of charged particles that pass though the electrostatic lens; and
detecting the charged particle beam current that passes the electrostatic focusing lens element to determine the energy or energy distribution of the charged particles in the beam.

2. The method of claim 1 in which:
applying a voltage to an element of the electrostatic lens includes applying a voltage that passes essentially all of the charged particles; and
incrementally changing the voltage on the element includes increasing the voltage on the element until essentially no charged particle beams pass through the electrostatic lens.

3. The method of claim 1 further comprising:
reducing the voltage on the electrostatic lens element to a focusing voltage suitable for charged particle processing of a sample; and
directing the charged particle beam toward a sample surface for processing a sample, all the steps being completed without removing the charged particle source from particle optical column so that energy analysis and then processing can both be performed without removing the charged particle source from particle optical column.

4. The method of claim 1 in which the voltage on the electrostatic lens produces a retarding field and further comprising aligning the beam with the retarding field.

5. The method of claim 4 in which aligning the beam includes aligning the beam while the voltage applied to the element is within 300 volts of the cut-off voltage.

6. The method of claim 4 in which aligning the beam includes aligning the beam when the electrostatic lens element provides a double crossover, one crossover within the lens and one crossover at the plane of the sample.

7. The method of claim 4 in which aligning the beam includes aligning the beam by observing an image formed from secondary electrons emitted as the primary beam impacts the target.

8. The method of claim 7 in which observing an image comprises forming an image of a Faraday cup to align the beam with a hole in a top of the Faraday cup.

9. The method of claim 1, wherein detecting the charged particle beam current that passes the electrostatic focusing lens element includes measuring the charged particle beam current using a Faraday cup and a current meter.

10. The method of claim 1, wherein detecting the charged particle beam current that passes the electrostatic lens element includes detecting stage current using an electrically biased stage, such that the secondary electrons are suppressed and the primary ion beam current is measured.

11. The method of claim 8 in which forming an image of the Faraday cup or other sample feature to align the beam with a hole in the top of the Faraday cup includes:
varying the focusing voltage of the optical column; and
observing whether or not the image shifts laterally, and
if the image of the hole shifts laterally as the focus changes, adjusting the position of the beam relative to the center of the lens until the image of the hole or other sample feature no longer shifts laterally as the focus changes.

12. The method of claim 1, wherein detecting the charged particle beam current that passes the electrostatic lens element includes detecting the gray level of a secondary electron image.

13. The method of claim 1, wherein incrementally changing the voltage on the element comprises changing the voltage during each increment by less than one twentieth of the beam energy spread.

14. The method of claim 1, wherein incrementally changing the voltage on the element comprises changing the voltage less 0.5 V during each increment.

15. The method of claim 14 further comprising determining the charged particle beam energy or energy distribution in the charged particle beam to a resolution of less than 0.5 V.

16. The method of claim 1 further comprising the adjusting the operation of a charged particle beam source based on the measured energy distribution of charged particles from the source to optimize performance.

17. The method of claim 16, wherein the particle source is a liquid metal ion source having a heater current flowing through a heating element that heats the liquid metal and wherein the measured energy distribution is used to determine whether or not the change the heater current.

18. A focused particle beam system, comprising:
a source of charged particles;
a focus column positioned to receive particles from the source, the focusing column including an electrostatic focusing lens for focusing the charged particles onto a work piece surface for processing the work piece;
a voltage-adjustable power supply electrically connected to said electrostatic lens and being capable of adjusting the second electrostatic lens voltage in increments less than 0.5 volts; and
a detector for measuring the charged particle beam current passing through electrostatic lens to determine the energy or energy distribution of the charged particles in the beam.

19. The focused particle beam system of claim 18 further comprising a computer memory storing computer instructions to:
automatically increment the voltage on the electrostatic lens until no charged particles pass the electrostatic lens; and
record an indication of the charged particle current passing through the electrostatic lens at each increment.

20. The focused particle beam system of claim 19 in which the detector comprises a secondary electron detector for detecting secondary electrons ejected from the sample in response to the impact of the primary charged particle beam and in which recording an indicator of the charged particle beam current includes recording a gray level.

21. The focused particle beam system of claim 19 in which the detector includes a current meter capable of measuring current to a precision of less than 2 picoamps and configured to measure beam current directed to a Faraday cup or stage current.

22. The focused particle beam system of claim 21 in which the detector comprises a Faraday cup capable of being moved under the beam for retarding field analysis and capable of being moved away from the beam to allow the beam to process a work piece.

23. The focused particle beam system of claim 21 in which the current measuring device is electrically connected to the Faraday cup or to the stage through a low noise electrical connector.

24. The focused particle beam system of claim 18, wherein the voltage-adjustable power supply is capable of adjusting the second electrostatic lens voltage in increments of less than 0.15 volts.

25. The focused particle beam system of claim 18, wherein the voltage-adjustable power supply includes one or more digital-to-analog converters having a total of more than 16 bits to provide the voltage on the electrostatic lens element.

* * * * *